(12) United States Patent
Cho et al.

(10) Patent No.: US 8,423,316 B2
(45) Date of Patent: Apr. 16, 2013

(54) CAMERA BASED POSITIONER FOR NEAR-FIELD MEASUREMENT AND METHOD THEREFOR, AND NEAR-FIELD MEASUREMENT SYSTEM

(75) Inventors: Yong-Heui Cho, Daejeon (KR); Soon-Soo Oh, Daejeon (KR); Jung-Ick Moon, Daejeon (KR); Joung-Myoun Kim, Daejeon (KR); Je-Hoon Yun, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 742 days.

(21) Appl. No.: 12/597,205

(22) PCT Filed: Apr. 24, 2008

(86) PCT No.: PCT/KR2008/002325
§ 371 (c)(1),
(2), (4) Date: Oct. 23, 2009

(87) PCT Pub. No.: WO2008/130202
PCT Pub. Date: Oct. 30, 2008

(65) Prior Publication Data
US 2010/0128124 A1    May 27, 2010

(30) Foreign Application Priority Data
Apr. 24, 2007 (KR) .................. 10-2007-0039957

(51) Int. Cl.
*G06F 15/00* (2006.01)

(52) U.S. Cl.
USPC ........... 702/127; 702/135; 348/116; 348/135; 343/703

(58) Field of Classification Search .................. 348/116, 348/135, 143; 343/703, 700 R; 702/127, 702/135, 151, 189
See application file for complete search history.

(56) References Cited

U.S. PATENT DOCUMENTS
2002/0095304 A1* 7/2002 Khazei ........................... 705/1

FOREIGN PATENT DOCUMENTS
| JP | 2001165975 A | 6/2001 |
| JP | 2001208786 A | 8/2001 |
| JP | 2003315012 A | 11/2003 |
| KR | 2004-0002162 A | 1/2004 |

\* cited by examiner

*Primary Examiner* — Frantz Jean
(74) *Attorney, Agent, or Firm* — Rabin & Berdo, P.C.

(57) ABSTRACT

A camera based positioner (CBP) for near-field measurement and a method therefor, and a near-field measurement system are provided. A measurement probe and an antenna under test (AUT) are automatically aligned to a position for near-field antenna measurement by recognizing a position and a rotation angle of the AUT based on an interval and an angle between neighboring laser sources represented in an image taken by emitting laser beams from at least two laser sources located with a predetermined interval and a predetermined angle.

9 Claims, 6 Drawing Sheets

FIG. 5

| ANTENNA TYPE | BASIC DIAGRAM OF AUT | MEDIA |
|---|---|---|
| DIPOLE ANTENNA | LINE | METAL |
| CIRCULAR LOOP ANTENNA | CIRCLE | METAL |
| POLYGON LOOP ANTENNA | POLYGON | METAL |
| HELICAL ANTENNA | UPPER CROSS SECTION : CIRCLE<br>SIDE CROSS SECTION : LINE | METAL |
| SPIRAL ANTENNA | LINES | METAL IN DIELECTRIC |
| HORN ANTENNA | QUADRANGLE | METAL |
| REFLECTOR ANTENNA | CIRCLE | METAL |
| MICROSTRIP PATCH ANTENNA | QUADRANGLE OR POLYGON | METAL IN DIELECTRIC |
| MICROSTRIP PATCH ARRAY ANTENNA | CENTERS OF QUADRANGLE OR POLYGON | METAL IN DIELECTRIC |

CAMERA BASED POSITIONER FOR NEAR-FIELD MEASUREMENT AND METHOD THEREFOR, AND NEAR-FIELD MEASUREMENT SYSTEM

CROSS-REFERENCE TO RELATED PATENT APPLICATION

This application claims the benefit of Korean Patent Application No. 10-2007-0039957, filed on Apr. 24, 2007, in the Korean Intellectual Property Office, the disclosure of which is incorporated herein in its entirety by reference.

BACKGROUND OF THE INVENTION

1. Field of the Invention

The present invention relates to a near-field antenna measurement system, and more particularly, to an automatic positioning method and apparatus for near-field antenna measurement.

2. Description of the Related Art

In order to align an antenna under test (AUT) and a measurement probe, the AUT radiates the radio frequency (RF) signal, and the measurement probe concurrently measures vertically and horizontally polarized waves of the RF signal, and the AUT and the measurement probe are optionally aligned through the measurement signal processing. If a signal to noise ratio (SNR) of the RF signal measured by the AUT and the measurement probe is low, an error occurs in a process of measuring a signal. Thus, accuracy of alignment of the AUT and the measurement probe is deteriorated. In addition, in case of an antenna in which a main beam of the AUT is polarized in a predetermined direction, the AUT and the measurement probe are aligned by searching for the maximum value of a signal. Accordingly, it is difficult to measure a deflection degree of the main beam through near-field measurement.

In order to align microwave antennas at several or tens of kilometers, an intensive laser beam is transmitted and received. A laser transmission device and a laser sensing device are mounted on an individual antenna. Antennas are aligned by using information on whether the laser beam is received. Accordingly, it is possible to obtain desired accuracy only when the laser transmission device and the laser sensing device are mounted on an accurate position of the antenna at an accurate position and an accurate angle. When the laser transmission device and the laser sensing device are attached or detached, alignment of the antennas is distorted. In addition, the size of the antennas has to be increased so that the laser transmission device and the laser sensing device are mounted on the antennas.

SUMMARY OF THE INVENTION

The present invention provides a camera based positioner (CBP) capable of automatically positioning a measurement probe and an antenna for near-field antenna measurement.

The present invention also provides an automatic positioning method and system for near-field antenna measurement by using a CBP.

Accordingly, it is possible to automatically position a measurement probe and an antenna for near-field antenna measurement.

BRIEF DESCRIPTION OF THE DRAWINGS

The above and other features and advantages of the present invention will become more apparent by describing in detail exemplary embodiments thereof with reference to the attached drawings in which:

FIG. 5 illustrates examples of basic diagrams of an AUT based on types of the AUT.

DETAILED DESCRIPTION OF THE INVENTION

Hereinafter, a camera based positioner, a positioning method for near-field antenna measurement, and a near filed antenna system will be described in detail with reference to the attached drawings.

Figure 1:
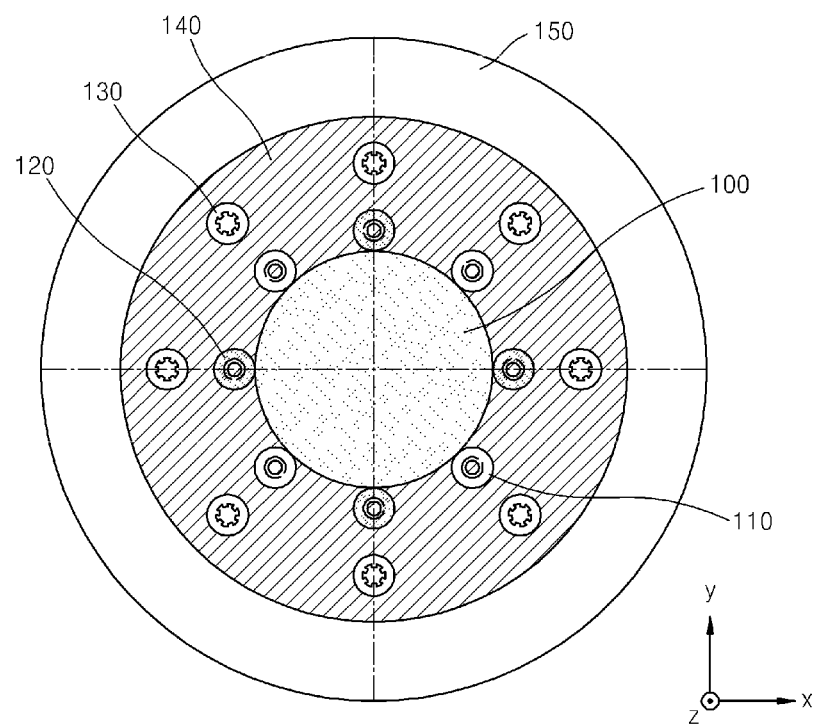
FIG. 1 is a front view illustrating a camera based positioner (CBP) according to an embodiment of the present invention.

FIG. 1 is a front view illustrating a camera based positioner (hereinafter, abbreviated to CBP) according to an embodiment of the present invention.

Referring to FIG. 1, the CBP includes an image pickup unit 100, a light source for illumination 110, a laser source unit 120, a metal container 150, and a probe mounting unit. The probe mounting unit is constructed with a probe fixing grooves 130 and an electromagnet region 140.

The image pickup unit 100 is constructed with a zoom lens, a charge-coupled device (CCD) camera, and an interface. The image pickup unit 100 transmits an image taken by using the CCD camera and the zoom lens to an external device (a personal computer, a database, and the like) through the interface. The zoom lens secures user convenience and increase image recognition resolution by automatically controlling a focus regardless of a distance between a measurement probe and an antenna under test (AUT).

The light source for illumination 110 increases the image recognition resolution through the CCD camera by illuminating an electromagnetic wave anechoic chamber in a case where it is difficult to normally recognize an image because the anechoic chamber is dark.

The laser source unit 120 includes a plurality of laser sources at a predetermined interval and at a predetermined angle from the center of the CBP. Each laser source emits a laser beam to the AUT so as to form a standard unit needed for alignment of positions or measurement of the size of the AUT. It is possible to accurately measure the size of the AUT in the x and y directions by using four laser sources shown in FIG. 1.

For example, the interval and the angle between neighboring laser sources among the four laser sources shown in FIG. 1 are previously set when the CBP is manufactured. When an AUT image is taken while the laser beam is being emitted to the AUT, the four laser sources are represented in the taken image. Since the interval and the angle between neighboring laser sources are previously known, it is possible to know a length and a rotation angle of each object in the image. That is, it is possible to automatically align the AUT and a measurement probe in a φ-direction (φ: a rotation angle with respect to a plane formed by the x and y axes) by using a standard unit generated by the laser sources and an image recognition technique.

The electromagnet region 140 enables the measurement probe to be easily detachable from the CBP. The probe fixing grooves 130 are included in the CBP so as to help the measurement probe to be attached or detached to or from the CBP and so as to strongly attach the measurement probe to the CBP.

In a case where AUT image recognition is performed by using the structure shown in FIG. 1, an AUT is recognized by a zoom lens of the image pickup unit 100 after removing the measurement probe. The measurement probe is mounted on the CBP for near-field measurement.

The CBP is enclosed with the CBP metal container 150 and connected to a positioning motor (not shown). The image pickup unit 100 is installed at a center of the CBP metal container 150 by punching a hole at the center of the CBP. When the CBP metal container 150 is rotated by the motor, the image pickup unit 100 is not rotated. The laser source unit 120 and the light source for illumination 110 are mounted on a surface of the CBP metal container 150 and rotated together with the CBP metal container 150 when the CBP metal container 150 is rotated by the motor.

Figure 2:
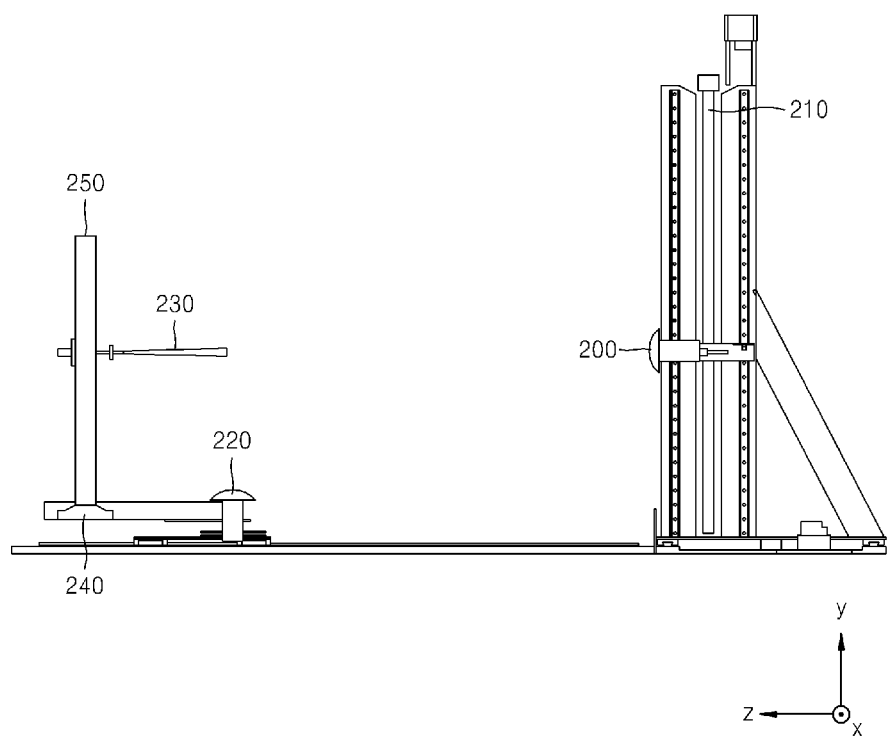
FIG. 2 illustrates a case where the CBP shown in FIG. 1 is installed in a near-field antenna system.

FIG. 2 illustrates a case where the CBP shown in FIG. 1 is installed in a near-field antenna system.

Referring to FIG. 2, the CBPs shown in FIG. 1 are mounted on the near-field antenna system so as to align centers and edges.

A center alignment CBP 200 is used to align an AUT 230 and a measurement probe (not shown) to the same center with respect to the x and y axes and automatically set rotation angles in the θ-direction (in the xy-plane) of the AUT 230 and the measurement probe (not shown). An x-y axis scanner 210 enables the center alignment CBP 200 to move on the xy-plane. A motor connected to the metal container of the center alignment CBP 200 enables the measurement probe to rotate in the φ-direction by enabling the metal container to rotate.

It is possible to measure horizontal and vertical sizes of the AUT 230 by using a standard unit of laser sources that are represented in an image taken by using the center alignment CBP 200. Since a zoom lens area of the center alignment CBP 200 is not connected to the motor but connected only to the CBP metal container, the CBP metal container rotates in the φ-direction. Accordingly, the zoom lens area does not move when the CBP metal container rotates in the φ-direction. Only the laser sources and the light sources for illumination move.

An edge alignment CBP 220 is used to automatically align an edge of the AUT to a center of a turntable 240 and align a rotation angle of the AUT 230 in a zx-plane so as to be parallel with the z-axis. In order to align the edge of the AUT to the center of the turntable 240, the turntable moves forwardly and backwardly in the z-axis direction. At this time, since a distance between the center of the turntable and the measurement probe is previously determined, if a back and forth movement distance of the turntable 240 in the z-axis is recognized, it is possible to know a distance between the AUT 230 and the measurement probe (not shown). It is possible to easily recognize a movement of the turntable 240 in the z-axis based on the number of moved steps of the motor in the z-axis.

Since the edge alignment CBP 220 needs not include the measurement probe, the electromagnet region and the probe fixing grooves of FIG. 1 may be omitted. In addition, since the edge alignment CBP 220 does not rotate, the edge alignment CBP 220 may be simply and fixedly mounted on the turntable.

Figure 3:
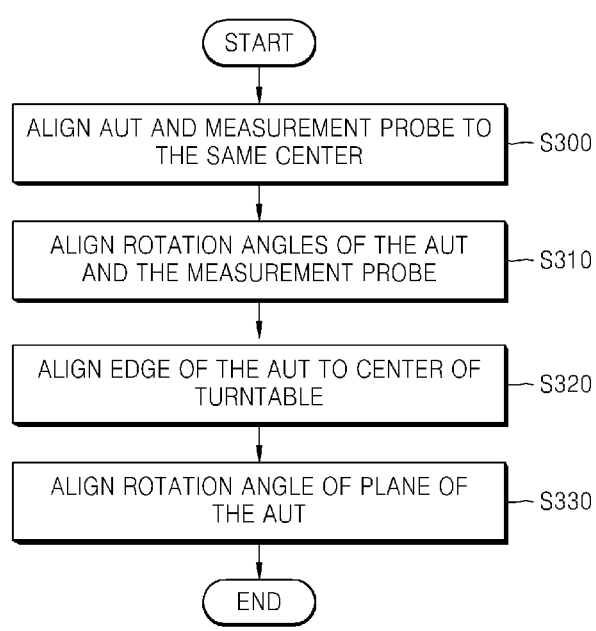
FIG. 3 is a flowchart of a positioning method for near-field antenna measurement according to an embodiment of the present invention.

FIG. 3 is a flowchart of a positioning method for near-field antenna measurement according to an embodiment of the present invention.

Referring to FIGS. 2 and 3, in the near-field antenna measurement system, the center and the rotation angle of the measurement probe that is mounted on the center alignment CBP 200 are aligned to the center and the rotation angle of the AUT 230 by using the center alignment CBP 200 (operations S300 and S310). In addition, in the near-field antenna measurement system, the edge of the AUT 230 is aligned to the center of the turntable 240 on which the AUT 230 is installed, by using the edge alignment CBP 220 (operation S320), and the rotation angle of the AUT 230 in the zx-plane is aligned so as to be parallel with the z-axis (operation S330).

Figure 4:
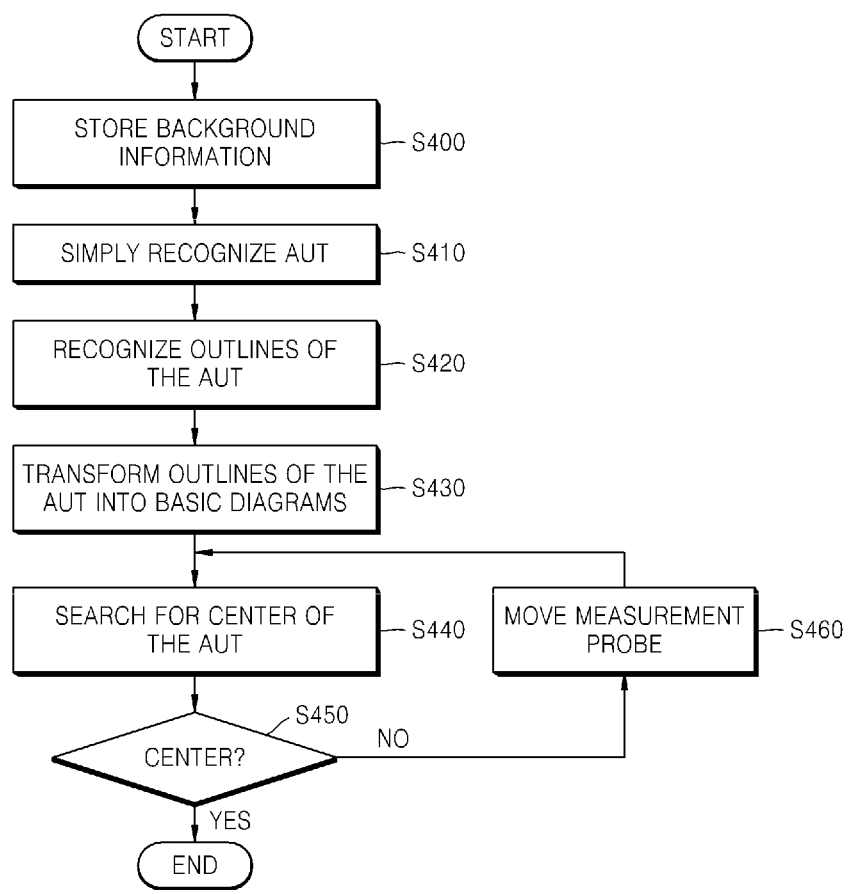
FIG. 4 is a flowchart of a method of positioning a measurement probe included in a positioning method for near-field antenna measurement according to an embodiment of the present invention.

FIG. 4 is a flowchart of a method of positioning a measurement probe included in a positioning method for near-field antenna measurement according to an embodiment of the present invention.

Referring to FIG. 4, the method of positioning the measurement probe includes storing background information on the AUT (operation S400), simply recognizing the AUT (operation S410), recognizing outlines of the AUT (operation S420), transforming outlines of the AUT into basic diagrams (operation S430), searching for a center of the AUT (operation S440), and positioning the measurement probe (operations S450 and S460). Hereinafter, the method of positioning the measurement probe by using the center alignment CBP 200 shown in FIG. 2 will be described.

In order to simply recognize the AUT 230, background information is necessary. The center alignment CBP 200 photographs backgrounds at a plurality of positions before the AUT 230 is mounted on the center alignment CBP 200 and stores the photographs in a database through an interface. At this time, it is preferable to store the background information together with photographing situations (a distance between a position at which the AUT is to be mounted and a position at which backgrounds are photographed, information on magnification of the zoom lens, and the like).

Since background images obtained before the AUT is mounted on the center alignment CBP 200 which is stored in the database cannot include all the images taken for all the cases, similar images are used by being reduced, magnified, or interpolated. For example, as described above, since it is possible to know the distance between the AUT 220 and the measurement probe (that is, the center alignment CBP 200), the previously taken background images are used by being magnified or reduced based on the distance.

In order to perform near-field antenna measurement, the center alignment CBP 200 takes an image of the AUT 230 in a state where the laser sources are turned on. At this time, in order to accurately recognize the AUT 230, a focal length or a magnifying power is automatically adjusted. Since an autofocusing function of the zoom lens was widely used in the past, detailed description on the autofocusing function will be omitted. In addition, the magnifying power may be determined based on a distance between the AUT and the center alignment CBP. Specifically, if a background image corresponding to a current distance between the AUT 230 and the center alignment CBP 200 exists in the database, it is preferable to automatically adjust the zoom lens so as to have a magnifying power that is the same as a magnifying power when the background image is taken.

An AUT area in the AUT image is recognized by taking an AUT image and obtaining a difference image (AUT image−background image) (operation S410). However, since illumination properties are different between the background images and the currently taken AUT image, it is advantageous to recognize the AUT area by obtaining the difference image after converting images into black and white images.

When the recognition of the AUT is completed, outline recognition of the AUT is performed (operation S420). The number of points constituting borders or outlines of an antenna is automatically determined in consideration of complexity of the antenna. The complexity of the outlines of the antenna is related to wavelength. In general, near-field measurement is performed by assuming a length that ranges from $\lambda_0/10$ to $\lambda_0/50$ as the minimum resolution. However, since the outlines of the AUT 230 may be not a radiator of the antenna, an algorithm for searching for outlines of the radiator of the antenna is necessary. Since the radiator of the antenna is generally made of metal except a dielectric antenna, metal and dielectric are distinguished from each other through image recognition. For example, in most cases, total reflection occurs in the metal, and scattered reflection occurs in the dielectric. Accordingly, the metal and the dielectric are distinguished from each other by using reflection properties of light when the image is recognized.

A geometry of a general antenna is simple. Accordingly, the recognized outlines of the AUT are transformed into basic diagrams of the AUT (operation S430). Here, the basic diagrams of the AUT are geometrically simple diagrams such as a line, a quadrangle, a polygon, a circle, and the like. FIG. 5 illustrates examples of basic diagrams of an AUT based on types of the AUT.

Since the center of the AUT used for automatic alignment is the center of the radiator of the antenna, the center of the AUT is determined after properties of the radiator are calculated by applying a virtual current to the antenna (operation S440). If centers of the basic diagrams of the AUT shown in FIG. 5 are determined through reflection properties by applying the virtual current, the determination result is used. Otherwise, in order to easily calculate the centers, since the outlines of the AUT are known, it is possible to determine the centers by calculating the center of gravity of the AUT.

An error between the center of the measurement probe and the center of the AUT is automatically calculated by illuminating the AUT 230 with the laser of the center alignment CBP 200 (operation S450 and S460). Since the interval between two neighboring laser sources are previously known in FIG. 1, red laser light is detected through image recognition, an absolute error of a distance is calculated. The calculated error is input into the x-y axis scanner 210, and the measurement probe (that is, the center alignment CBP 200 on which the measurement probe is mounted) moves by the error. If this procedure is repeatedly performed until an error is within an error tolerance, the AUT and the measurement probe are automatically aligned with respect to the xy-plane.

The AUT and the measurement probe are automatically aligned in the φ-direction by using the aforementioned procedures. An error in the φ-direction is automatically detected by comparing a standard in the φ-direction with a slope of the measurement probe in the φ-direction by illuminating the AUT with the laser light of the center alignment CBP. Since four laser sources are installed at an interval of 90 degrees, it is possible to calculate an absolute error of an angle. At this time, the outline recognition of the AUT and transformation of the outlines of the AUT into basic diagrams have to be firstly performed.

If the error in the φ-direction is obtained, alignment in the φ-direction is automatically performed by moving the measurement probe (that is, the metal container on which the measurement probe is to be mounted) by a desired angle by driving the motor connected to the metal container of the center alignment CBP by the error.

The edge alignment CBP 220 is used to align the AUT 230 and the turntable 240. An edge of the AUT 230 is recognized and aligned instead of the center of the AUT 230. The same procedures as the aforementioned image recognition procedures will be performed. However, since background information for edge alignment is different from the background information for the center alignment, the background information for edge alignment has to be previously obtained.

Figure 6:
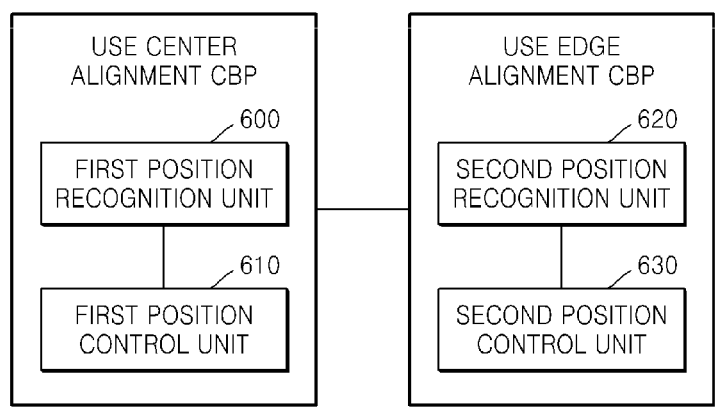
FIG. 6 illustrates a structure of a near-field antenna measurement system capable of automatically positioning an AUT according to an embodiment of the present invention.

FIG. 6 illustrates a structure of a near-field antenna measurement system capable of automatically positioning an AUT according to an embodiment of the present invention.

Referring to FIG. 6, the near-field antenna measurement system includes a first position recognition unit 600 and a first position control unit 610 which use the center alignment CBP 200 and a second position recognition unit 620 and a second position control unit 630 which use the edge alignment CBP 220.

The first position recognition unit 600 recognizes a position and a rotation angle of the AUT based on an interval and an angle between neighboring laser source represented in an image taken by emitting laser beams from at least two laser sources facing the AUT which are located with a predetermined interval and a predetermined angle. The center alignment CBP 200 corresponding to the first position recognition unit 600 was described in detail with reference to FIGS. 2 and 4.

The first position control unit 610 aligns the center and the rotation angle of the measurement probe to the center and the rotation angle of the AUT based on the position and the rotation angle of the AUT which are recognized by the first position recognition unit 600.

The second position recognition unit 620 recognizes a position and a rotation angle of the AUT based on an interval and an angle between neighboring laser sources represented in an image taken by emitting laser beams from at least two laser sources under the AUT which are located with a predetermined interval and a predetermined angle. The edge alignment CBP 220 corresponding to the second position recognition unit 620 was described in detail with reference to FIGS. 2 and 4.

The second position control unit 630 aligns an end point of the AUT to the center of the turntable and aligns the rotation angle of the AUT to the axis direction in which the AUT is connected to the measurement probe based on the position and the rotation angle of the AUT recognized by the second position recognition unit 620.

According to an embodiment of the present invention, it is possible to automatically determine initial settings of the near-field antenna measurement system by using the CBP and the image recognition technique. Since the initial settings for driving the near-field antenna measurement system are not automatically determined, it takes most time for preparing measurement of the antenna to determine the initial settings. Accordingly, if the initial settings are automatically determined, the near-field antenna measurement is automated. A measurement system operator needs not handle the near-field antenna measurement system except installation of the AUT and inserting of the measurement probe. Thus, it is possible to improve measurement efficiency.

While the present invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A CBP (camera based positioner) for near-field antenna measurement, the CBP comprising:
   a laser source unit including at least two laser sources located with a predetermined interval and a predetermined angle from a center of the CBP;
   an image pickup unit to pick up an image of an AUT (antenna under test); and
   a probe mounting unit to mount a measurement probe for near-field measurement of the AUT on the center, the probe mounting unit surrounding the image pickup unit.

2. The CBP of claim 1, wherein the laser source unit includes four laser sources located at an interval of 90 degrees with reference to the center.

3. The CBP of claim 1, wherein the probe mounting unit includes:
   an electromagnet region forming an electromagnet with a toroidal shape surrounding the image pickup unit; and
   probe fixing grooves formed in the electromagnetic region at a predetermined interval, the probe fixing grooves to fix the measurement probe.

4. The CBP of claim 1, further comprising a light source unit for illumination to provide illumination when the image pickup unit picks up an image.

5. The CBP of claim 1, further comprising a rotatable container,
   wherein the laser source unit and the probe mounting unit are formed on the container and are to be moved together with the container, and
   wherein the image pickup unit is fixed to a center of the container.

6. A positioning method for near-field antenna measurement, the positioning method comprising:
   recognizing a first position and a first rotation angle of an AUT (antenna under test) based on an interval and an angle between neighboring first laser sources represented in an image taken by emitting laser beams from at least two first laser sources facing the AUT which are located with a predetermined interval and a predetermined angle;
   aligning a center and a rotation angle of a measurement probe to a center and a rotation angle of the AUT based on the first position and the first rotation angle of the AUT;
   recognizing a second position and a second rotation angle of the AUT based on an interval and an angle between neighboring second laser sources represented in an image taken by emitting laser beams from at least two second laser sources under the AUT which are located with a predetermined interval and a predetermined angle; and
   aligning an end point of the AUT to a predetermined position and aligning the rotation angle of the AUT to an axis direction in which the AUT is connected to the measurement probe based on the second position and the second rotation angle.

7. The positioning method of claim 6, wherein the recognizing of the first position comprises:
   storing background images, which are taken at a position facing the AUT before installing the AUT, in a database;
   recognizing an area of the AUT from the taken images by using a difference image between an image taken by emitting laser beams from the first laser sources and the background images;
   searching for a corresponding basic diagram of an antenna by comparing outlines of the antenna area with previously stored various types of basic diagrams of an antenna; and
   recognizing a center and a rotation angle of the AUT based on the found basic diagram of the antenna.

8. The positioning method of claim 6, wherein the recognizing of the second position comprises:
   storing background images, which are taken at a position under the AUT before installing the AUT, in a database;
   recognizing an area of the AUT from the taken images by using a difference image between an image taken by emitting laser beams from the second laser sources and the background images;
   searching for a corresponding basic diagram of an antenna by comparing outlines of the antenna area with previously stored various types of basic diagrams of an antenna; and
   recognizing the end point and the rotation angle of the AUT based on the found basic diagram of the antenna.

9. A near-field measurement system comprising:
   a first position recognition unit to recognize a first position and a first rotation angle of an AUT (antenna under test) based on an interval and an angle between neighboring first laser sources represented in an image taken by emitting laser beams from at least two first laser sources facing the AUT which are located with a predetermined interval and a predetermined angle;
   a first position control unit to align a center and a rotation angle of a measurement probe to a center and a rotation angle of the AUT based on the first position and the first rotation angle of the AUT;
   a second position recognition unit to recognize a second position and a second rotation angle of the AUT based on an interval and an angle between neighboring second laser sources represented in an image taken by emitting laser beams from at least two second laser sources under the AUT which are located with a predetermined interval and a predetermined angle; and
   a second position control unit to align an end point of the AUT to a predetermined position and to align the rotation angle of the AUT to an axis direction in which the AUT is connected to the measurement probe based on the second position and the second rotation angle.

* * * * *